United States Patent
Kim et al.

(10) Patent No.: US 12,041,816 B2
(45) Date of Patent: Jul. 16, 2024

(54) LIGHT-EMITTING DISPLAY DEVICE COMPRISING OPTICAL COMPENSATION STRUCTURE ON TRANSMISSIVE ELECTRODE

(71) Applicant: LG Display Co., Ltd., Seoul (KR)

(72) Inventors: Jae Hyeon Kim, Paju-si (KR); Kwan Soo Kim, Seoul (KR); Min Jee Kim, Seoul (KR); Seok Hyun Kim, Seoul (KR); Young Nam Lim, Seoul (KR); Min Geun Song, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 102 days.

(21) Appl. No.: 17/548,272

(22) Filed: Dec. 10, 2021

(65) Prior Publication Data
US 2022/0209195 A1    Jun. 30, 2022

(30) Foreign Application Priority Data
Dec. 31, 2020  (KR) .................. 10-2020-0190035

(51) Int. Cl.
| | |
|---|---|
| *H10K 50/856* | (2023.01) |
| *H10K 50/818* | (2023.01) |
| *H10K 50/84* | (2023.01) |
| *H10K 50/852* | (2023.01) |
| *H10K 50/858* | (2023.01) |
| *H10K 59/38* | (2023.01) |

(52) U.S. Cl.
CPC ......... *H10K 50/856* (2023.02); *H10K 50/818* (2023.02); *H10K 50/84* (2023.02); *H10K 50/852* (2023.02); *H10K 50/858* (2023.02); *H10K 59/38* (2023.02)

(58) Field of Classification Search
None
See application file for complete search history.

(56) References Cited

U.S. PATENT DOCUMENTS

| | | | | |
|---|---|---|---|---|
| 2008/0238308 | A1* | 10/2008 | So ................. | H10K 50/125 445/24 |
| 2020/0212130 | A1* | 7/2020 | Kim ............. | H10K 50/818 |
| 2020/0220108 | A1* | 7/2020 | Irobe ............. | G02B 5/32 |
| 2020/0220116 | A1* | 7/2020 | Fukagawa ..... | H10K 71/00 |
| 2021/0359274 | A1* | 11/2021 | Kim ............. | H10K 50/844 |

FOREIGN PATENT DOCUMENTS

| | | |
|---|---|---|
| KR | 10-1106920 B1 | 1/2012 |
| KR | 10-2017-0001826 A | 1/2017 |
| KR | 10-2019-0143556 A | 12/2019 |
| KR | 10-2020-0082763 A | 7/2020 |

* cited by examiner

*Primary Examiner* — Daniel Whalen
(74) *Attorney, Agent, or Firm* — Birch, Stewart, Kolasch & Birch, LLP

(57) ABSTRACT

Discussed is a light-emitting display device, which emits light unchanged by maintaining a cavity of internal light using reverse cavity characteristics through an optical compensation structure, and achieves high luminance characteristics despite a change in a viewing angle, prevents external light from being reflected, and is excellent in terms of efficiency and lifespan by combining the optical compensation structure with a color filter structure. The optical compensation structure includes at least one first layer having a first refractive index and at least one second layer having a second refractive index greater than the first refractive index, the first layer being thicker than the second layer.

19 Claims, 16 Drawing Sheets

$n_1 < n_2$ $n_1 < n_2$

LIGHT-EMITTING DISPLAY DEVICE COMPRISING OPTICAL COMPENSATION STRUCTURE ON TRANSMISSIVE ELECTRODE

CROSS-REFERENCE TO RELATED APPLICATIONS

This application claims the priority benefit of Korean Patent Application No. 10-2020-0190035, filed in the Republic of Korea on Dec. 31, 2020, the entire contents of which are hereby expressly incorporated by reference as if fully set forth herein into the present application.

BACKGROUND OF THE DISCLOSURE

Field of the Disclosure

Embodiments of present disclosure relate to a display device, and more particularly to a light-emitting display device for preventing viewing angle from being changed depending on luminance and maintaining high luminance irrespective of the viewing angle by changing the configuration.

Discussion of the Related Art

Self-luminous display devices such as organic light-emitting displays or quantum dot light-emitting displays for compact and clear color display without a separate light source have been considered as a competitive application thereof.

A self-luminous display device includes a plurality of pixels on a substrate, first and second electrodes facing each other in each pixel, and a light-emitting diode including a light-emitting layer therebetween.

SUMMARY OF THE DISCLOSURE

A light-emitting display device is designed using a principle in which light resonates between two opposing electrodes and is optimized for a front emission type device, and accordingly, there can be a limitation in that luminance may be degraded when the viewing angle of a display is changed.

To address this and other limitations, the embodiments of the present disclosure provide a light-emitting display device for allowing a user to view an image with high luminance in any direction by changing an internal structure of the light-emitting display device to reduce the dependence on a wavelength with respect to viewing angle of emitted light.

A light-emitting display device according to the embodiments of the present disclosure can emit light unchanged by maintaining a cavity of internal light using reverse cavity characteristics through an optical compensation structure, and can achieve high luminance characteristics despite change in viewing angle, can prevent external light from being reflected, and can be excellent in terms of efficiency and lifespan by combining the optical compensation structure with a color filter structure.

In an aspect, an embodiment of the present disclosure provides a display device including a substrate including a plurality of light-emitting units, a light-emitting layer at a light-emitting unit, a reflective structure between the light-emitting layer and the substrate in the light-emitting unit, a transmissive electrode over the light-emitting layer across a plurality of pixels on the substrate, an optical compensation structure in contact with the transmissive electrode and having destructive interference characteristics, an encapsulation layer on the optical compensation structure, and a color filter on the encapsulation layer.

The display device can include a first layer of a first refractive index and a second layer of a second refractive index greater than the first refractive index, and a thickness of the first layer can be 1.8 to 2.2 times greater than the second layer.

In another aspect, an embodiment of the present disclosure provides a display device including a light-emitting device including a light-emitting layer on the substrate, an optical compensation structure including a first layer of a first refractive index and a second layer of a second refractive index, disposed on the light-emitting device, the first layer being thicker than the second layer, an encapsulation layer on the optical compensation structure, and a color filter on the encapsulation layer.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE EMBODIMENTS

Figure 1:
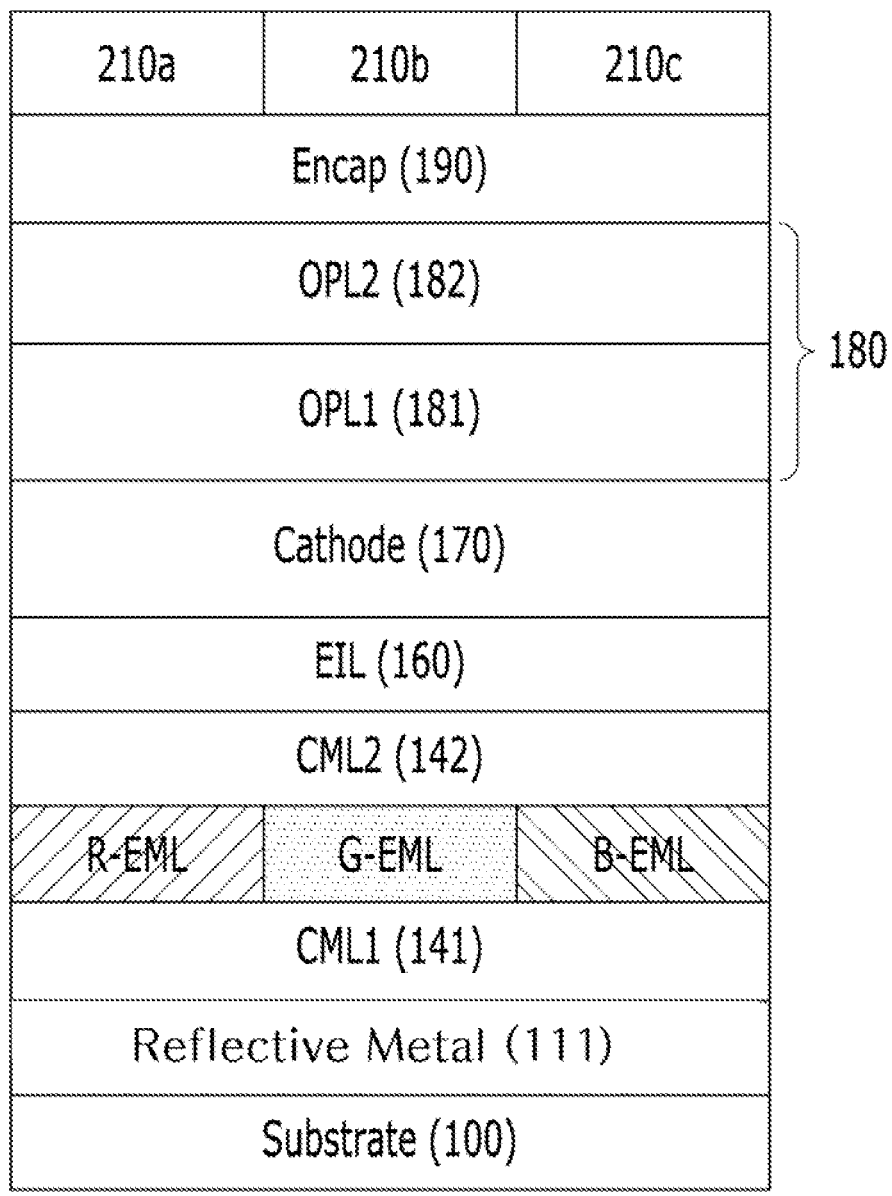
FIG. 1 is a cross-sectional view of a light-emitting display device according to a first embodiment of the present disclosure.

Reference will now be made in detail to the example embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it can make the subject matter of the embodiments of the present invention rather unclear. Further, the names of elements used in the following description of the embodiments of the present invention are selected in consideration of ease of preparation of the specification, and can thus differ from the names of parts of an actual product.

The shapes, sizes, ratios, angles and numbers of elements given in the drawings to describe the embodiments of the present invention are merely by example, and thus, the embodiments of the present invention are not limited to the illustrated details. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In the interpretation of elements included in the various embodiments of the present invention, it is to be interpreted that the elements include error ranges unless stated otherwise.

In the following description of the embodiments, it will be understood that, when positional relationships are expressed, for example, when an element is said to be "on", "above", "under" or "beside" another element, the two elements can directly contact each other, or one or more other elements can be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements. Therefore, a first element described hereinafter could be termed a second element without departing from the technical scope of the invention.

Respective features of the various embodiments of the present invention can be partially or wholly coupled to or combined with each other and be interlocked or driven in various technical manners, and the respective embodiments can be implemented independently of each other or be implemented together through connection therebetween.

Hereinafter, the embodiments of the present disclosure will be described more fully with reference to the accompanying drawings, in which example embodiments of the disclosure are shown.

FIG. 1 is a cross-sectional view of a light-emitting display device according to a first embodiment of the present disclosure. All the components of the display device according to all embodiments of the present invention are operatively coupled and configured.

As shown in FIG. 1, the light-emitting display device according to the first embodiment of the present disclosure can include a substrate 100 having a plurality of light-emitting units, light-emitting layers R-EML, G-EML, and B-EML included in a light-emitting unit, a reflective structure (or a reflective layer) 111 disposed between the light-emitting layers R-EML, G-EML, and B-EML and the substrate 100 in the light-emitting unit, a transmissive electrode (e.g., cathode) 170 positioned above the light-emitting layer over a plurality of pixels on the substrate, an optical compensation structure 180 that is in contact with the transmissive electrode 170 and has destructive interference characteristics, an encapsulation layer 190 on the optical compensation structure 180, and color filters 210a, 210b, and 210c on the encapsulation layer 190.

The light-emitting display device according to the first embodiment of the present disclosure can use the reflective structure 111 formed of a reflective metal as a first electrode of a light-emitting device.

The first electrode 111 of the light-emitting device according to the embodiments of the present disclosure can function as an anode and the second electrode 170 can function as a cathode.

A device including the reflective structure 111 of the first electrode, the second electrode 170, and layers 141, emission layers 142, such as R-EML/G-EML/B-EML and an electrode injection layer (EIL) 160 therebetween is referred to as a light-emitting device.

Here, when the reflective structure 111 is formed of a reflective metal, if the reflective structure 111 has a thickness equal to or greater than 100 nm, uniform reflectivity with respect to all wavelengths can be achieved.

The optical compensation structure 180 can have destructive interference characteristics whereby the amount of light that returns inside the light-emitting device is reduced by reducing most reflection of light, which is generated by the light-emitting device and is transmitted through the second electrode 170, at an interface between the second electrode 170 and the optical compensation structure 180 and light transferred from a lower portion of the light-emitting device is transmitted out of the optical compensation structure 180. For example, light has low reflectivity at the second electrode 170 and the optical compensation structure 180 and most of the light is transmitted therethrough.

A principle of light transmitted through the optical compensation structure 180 from the second electrode 170 of the light-emitting device according to the embodiments of the present disclosure will be described. When the optical compensation structure 180 includes a plurality of insulating layers, an optical distance between the insulating layers generally has a condition represented by Expression 1 below.

$$n_d d = \left(m + \frac{\delta}{\pi}\right)\frac{\lambda}{4}, \text{ for dielectric } \delta = \pi, m = 0, 2, 4\ldots \quad \text{[Expression 1]}$$

However, in the display device according to the embodiments of the present disclosure, light is transmitted through the second electrode 170 of an electrode component and the optical compensation structure 180 of the insulating layer, and thus the optical distance between the insulating layers can be calculated in further consideration of reflection at a metal based on a principle represented by Expression 2 below.

$$n_d d = \left(m + 1 - \frac{\delta}{\pi}\right)\frac{\lambda}{4}, \text{ for metal } m = 0, 2, 4\ldots \quad \text{[Expression 2]}$$

Here, δ can be a phase at an interface, can be 0 or π in the instance of an insulating layer, and can be 0 or π in the instance of a metal interface.

In this instance, when Expression 2 above is considered in order to maintain the destructive interference characteristics of the optical compensation structure 180 according to the embodiments of the present disclosure and a wavelength of light emitted from the light-emitting device is λ, a condition of the aforementioned expression can be satisfied in consideration of the thickness of the optical compensation structure 180 and a refractive index of a material of the insulating layer included therein. When there is a plurality of insulating layers having different refractive indexes in the optical compensation layer, the effective refractive index can be calculated in consideration of a volume ratio of the insulating layers.

For example, when the optical compensation structure 180 includes a first layer 181 (e.g., OPL1) and a second layer 182 (e.g., OPL2) for destructive interference, the thickness of a layer having a low refractive index can be at least 1.8 to 2.2 times greater than the thickness of a layer having a high refractive index.

The display device according to the embodiments of the present disclosure can include the color filters 210a, 210b, and 210c on the encapsulation layer 190 for protecting the light-emitting device, and even if there is no separate polarizer, the color filters 210a, 210b, and 210c can shield external light, thereby improving optical efficiency.

Thus, the display device according to the embodiments of the present disclosure can include the reflective structure 111, the optical compensation structure 180 having destructive interference characteristics and disposed above the light-emitting device, and the color filters 210a, 210b, and 210c, and thus the efficiency of light emitted inside the display device can be improved and external light can be prevented from being reflected.

For example, the encapsulation layer 190 can be formed by alternately stacking an inorganic encapsulation layer and an organic encapsulation layer or can be configured by disposing an inorganic protection layer on the optical compensation structure 180 and applying an opposite substrate and a face seal thereto.

The color filters 210a, 210b, and 210c can be coated directly on the encapsulation layer 190, or when the opposite substrate is applied, the color filters 210a, 210b, and 210c can be disposed inside or above the opposite substrate.

The light-emitting device can include a first common layer CML1 141 between the reflective structure 111 used as the first electrode and the light-emitting layers R-EML, G-EML, and B-EML and can include a second common layer CML2 142 between the light-emitting layers R-EML, G-EML, and B-EML and the second electrode 170. An electron injection layer 160 can be formed directly below the second electrode 170. The electron injection layer 160 can be formed of an inorganic material for improving electron injection efficiency and increasing reliability with respect to ultraviolet rays, and in this instance, can be formed of a different source from that of the second electrode 170 in a chamber for forming the same.

The light-emitting layers R-EML, G-EML, and B-EML can be selectively and separately formed in regions of the light-emitting unit, which are separated by banks, and each light-emitting unit can emit light with corresponding color.

The first common layer CML1 141 can include a hole injection layer, a hole transfer layer, and an electron blocking layer, which are related to injection and transfer of holes among others.

The second common layer CML2 142 can include a hole blocking layer and an electron transfer layer among others.

Each or any one of the first and second common layers CML1 and CML2 141 and 142 can include a plurality of layers, and the first and second common layers CML1 and CML2 can be commonly formed in the light-emitting units and can be integrally formed in the light-emitting units.

Hereinafter, the optical compensation structure 180 according to embodiments of the present disclosure will be described.

Figure 2A:
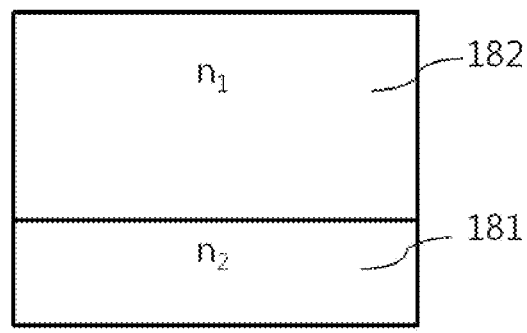
FIGS. 2A to 2C are cross-sectional views showing an example of an optical compensation structure according to various embodiments of the present disclosure.
Figure 2B:
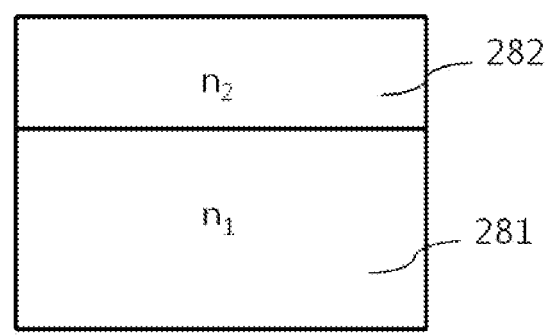
Figure 2C:
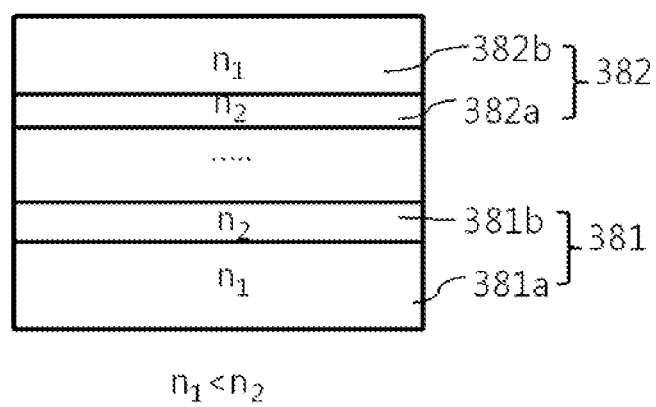

FIGS. 2A to 2C are cross-sectional views showing an example of an optical compensation structure according to various embodiments of the present disclosure.

As shown in FIG. 2A, the optical compensation structure can be configured by stacking the first layer 181 of a high refractive index $n_2$ and the second layer 182 of a low refractive index $n_1$. In this instance, the thickness of the second layer 182 of the low refractive index can be further increased, and in order to satisfy the destructive interference characteristics, the thickness of the second layer 182 can be approximately 1.8 to 2.2 times greater than the thickness of the first layer 181.

As shown in FIG. 2B, another optical compensation structure can be configured by stacking a first layer 281 of a low refractive index and a second layer 282 of a high refractive index. In this instance, the thickness of the first layer 281 of the low refractive index can be further increased, and in order to satisfy the destructive interference characteristics, the thickness of the first layer 281 can be approximately 1.8 to 2.2 times greater than the thickness of the second layer 282.

As shown in FIG. 2C, another optical compensation structure can include a plurality of units 381 and 382 having low refractive index layers 381a, . . . , 382b and high refractive index layers 381b, . . . , 382a, while it need not be required to alternately position the low refractive index layer and the high refractive index layer, the lowermost portion can correspond to the low refractive index layer 381a and can be in contact with the second electrode 170 of FIG. 1, and the uppermost portion can be in contact with the encapsulation layer 190. In this instance, the thickness of a layer of a low refractive index can be further increased, and in order to satisfy destructive interference characteristics, the thickness of the layer of the low refractive index can be approximately 1.8 to 2.2 times greater than the thickness of a layer of a high refractive index.

The aforementioned light-emitting display device according to the embodiments of the present disclosure can be used to achieve viewing angle with high luminance, and internal emission efficiency of the light-emitting device can be improved through destructive interference of the optical compensation structure 180.

As such, even if the reflective structure 111 functioning as the first electrode has low reflectivity of as low as 70% to 90%, this can be compensated for by improving an emission function of the optical compensation structure 180, which can correspond to a substitute function for improvement in efficiency using a reflective electrode having high reflectivity at a level of 99% in a structure without the optical compensation structure 180. The reflective structure 111 can be formed of a metal, for example, aluminum, silver, silver alloy, aluminum alloy, or the like and can also be formed of high-reflective alloy such as Ag—Pd—Cu (APC) or the like. Other materials can be used.

Figure 3:
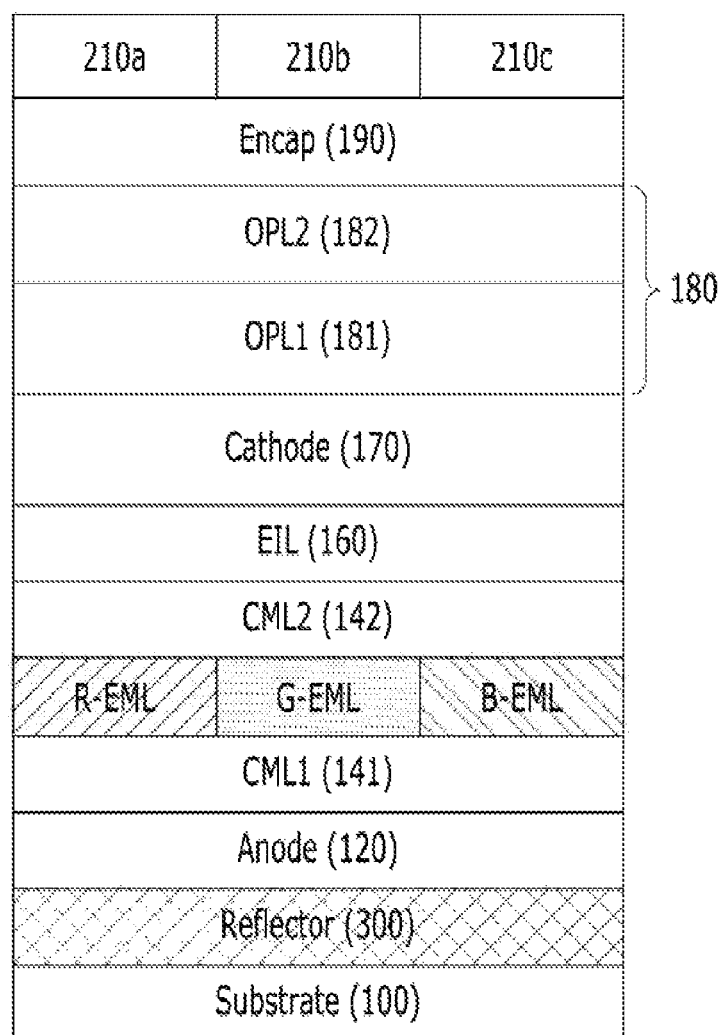
FIG. 3 is a cross-sectional view of a light-emitting display device according to a second embodiment of the present disclosure.
Figure 4:
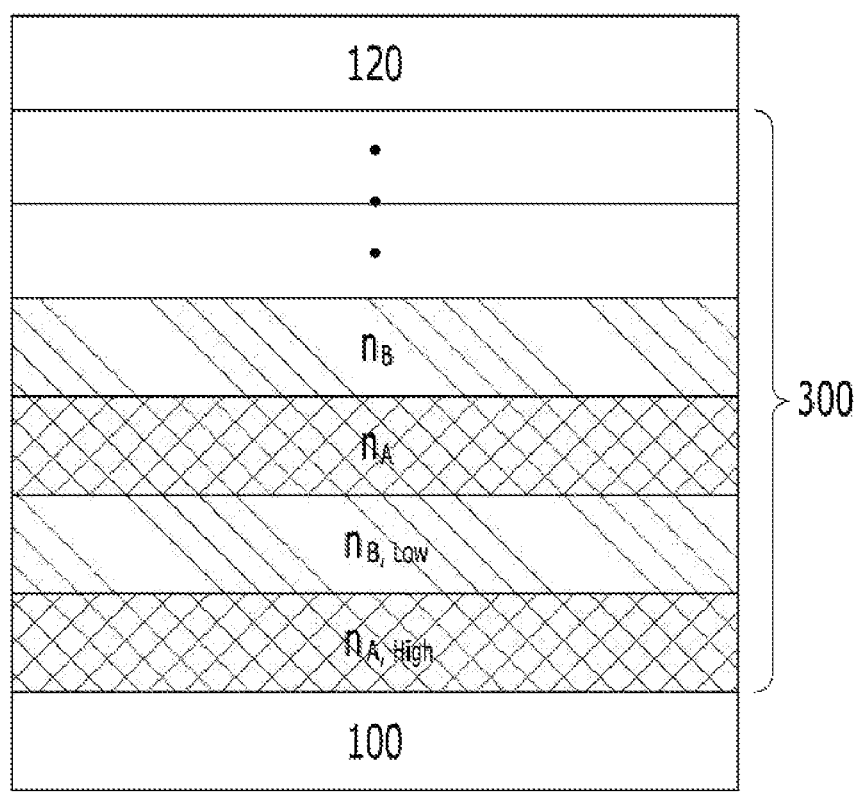
FIG. 4 is a cross-sectional view of a dielectric Bragg mirror of FIG. 3.
Figure 5A:
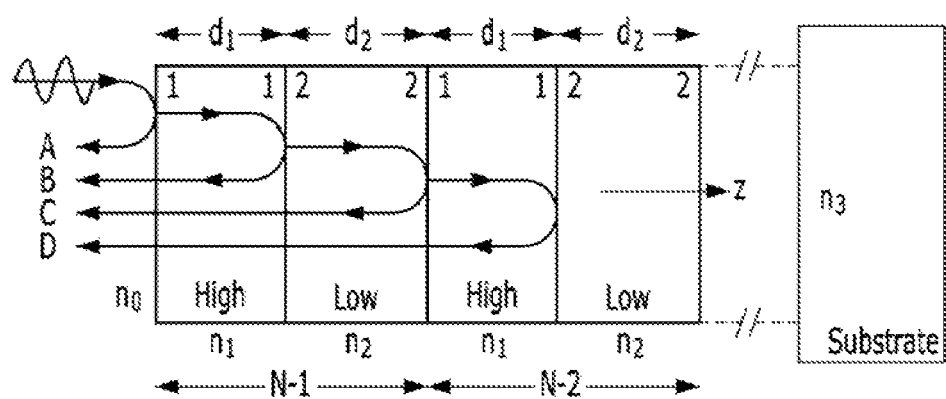
FIGS. 5A and 5B are graphs showing a principle of a reflective mirror of a dielectric Bragg mirror and reflectivity thereof.
Figure 5B:
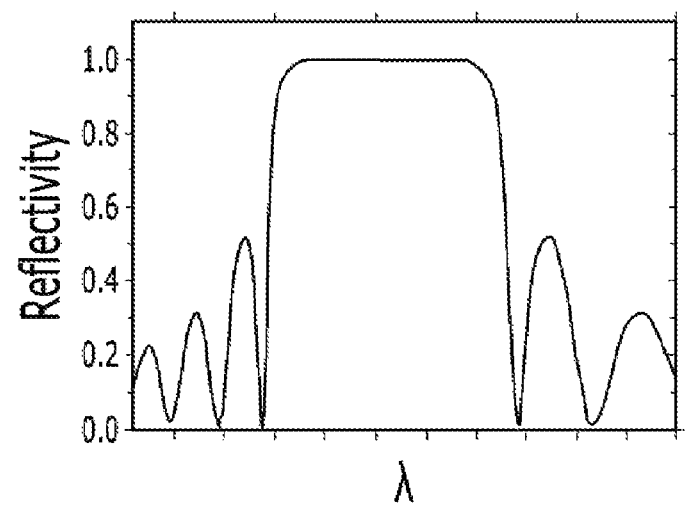

FIG. 3 is a cross-sectional view of a light-emitting display device according to a second embodiment of the present disclosure. FIG. 4 is a cross-sectional view of a dielectric Bragg mirror of FIG. 3. FIGS. 5A and 5B are graphs showing the principle of a reflective mirror of a dielectric Bragg mirror and reflectivity thereof.

In the light-emitting display device of FIG. 3 according to the second embodiment of the present disclosure, a reflective structure 300 or a reflector of the light-emitting device can be configured separately from a first electrode 120.

Here, the reflective structure 300 can be formed as a metallic reflector but can also be formed of an insulating dielectric material, or a combination thereof.

When the reflective structure 300 is a metallic reflector, the reflective structure 300 can have a thickness of 100 nm or can satisfy a condition represented using Expression 3 below.

$$0.3 < 1 - \left[\frac{(n-1)^2 + k^2}{(n+1)^2 + k^2}\right] < 0.03 \quad \text{[Expression 3]}$$

Here, n is a refractive index and k is an extinction coefficient.

Also, the reflective structure 300 can be formed of an insulating dielectric material and can use a principle of a dielectric Bragg mirror (DBR).

As shown in FIG. 4, the reflective structure 300 of the dielectric Bragg mirror can be configured by alternately arranging a high refractive index layer $n_A$ and a low refractive index layer $n_B$, and as shown in FIG. 5A, can be a structure formed in multiple layers of alternating materials by which an effective refractive index is periodically changed. A boundary between layers can cause partial reflection of light waves and reflectivity can be maximized in a specific wavelength range, as shown in FIG. 5B.

As shown in FIG. 3, the light-emitting display device according to the second embodiment can share the reflective structure 300 of the Bragg mirror with respect to light-emitting units, and in order to achieve uniform reflectivity in the visible spectrum, a peak wavelength for maximizing reflectivity can be determined in a green wavelength. For example, the peak wavelength can be 560 nm to 600 nm. When refractive indexes of the high refractive index layer $n_A$ and the low refractive index layer $n_B$ are $n_A$ and $n_B$, the reflective structure 300 can be designed to satisfy Expressions 4 to 6 below.

$$m\lambda_{peak} = 2(n_A d_A + n_B d_B), \lambda = 560 \text{ to } 600 \text{ nm} \quad \text{[Expression 4]}$$

$$0.3 < 1 - [(n_B^{2N} - n_A^{2N})(n_B^{2N} + n_A^{2N})]2 < 0.03, N: \text{\# of bilayer } (AB) \quad \text{[[Expression 5]}$$

$$\Delta\lambda = \lambda_{peak} * \left|\frac{4}{\pi}\sin^{-1}\left(\frac{n_B - n_A}{n_B + n_A}\right)\right|, \Delta\lambda > 320 \text{ nm} \quad \text{[Expression 6]}$$

According to the second embodiment, the reflective structure 300 of the dielectric Bragg mirror can be included in light-emitting units emitting light with different colors, and the reflective structure 300 is insulating, and thus a transparent electrode can be further formed on the reflective structure 300 so as to function as the first electrode 120. The transparent electrode 120 can have a thickness equal to or greater than 3 nm to be used as a reflective surface when light resonates in the light-emitting device.

Figure 6:
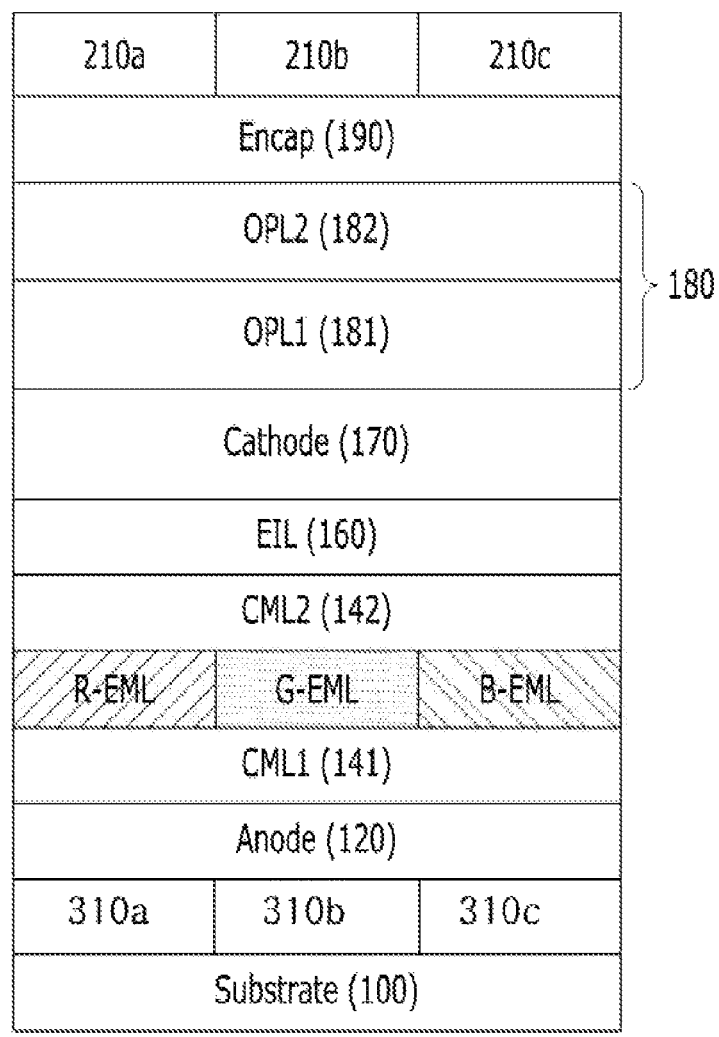
FIG. 6 is a cross-sectional view of a light-emitting display device according to a third embodiment of the present disclosure.

FIG. 6 is a cross-sectional view of a light-emitting display device according to a third embodiment of the present disclosure.

As shown in FIG. 6, the light-emitting display device according to the third embodiment of the present disclosure can be configured by applying different first to third reflective structures 310a, 310b, and 310c to a red light-emitting unit, a green light-emitting unit, and a blue light-emitting unit, respectively.

In this instance, the light-emitting display device can be designed using the same expression in such a way that the red light-emitting unit has wavelength peaks of 600 nm to 660 nm in FIGS. 3 and 5, the green light-emitting unit has wavelength peaks of 490 nm to 550 nm in FIGS. 3 and 5, and the blue light-emitting unit has wavelength peaks of 430 nm to 490 nm in FIGS. 3 and 5. However, because the wavelength peaks are different, the high refractive index layer and the low refractive index layer to be applied to the first to third reflective structures 310a, 310b, and 310c can be differently or individually applied.

Hereinafter, an effect of the light-emitting display device according to the embodiments of the present disclosure will be described.

Hereinafter, in a first experimental example Ex1, the color filter and the optical compensation structure of FIG. 1 need not be applied, and a high refractive index capping layer can be applied and a polarizer can also be applied above a panel.

In the second experimental example Ex2, the optical compensation structure of FIG. 1 can be applied, and the color filter need not be applied.

In each of a third experimental example Ex3 and a fourth experimental example Ex4, the optical compensation structure of FIG. 1 can be applied and color filters with different thicknesses can be applied, and in this regard, in the third experimental example Ex3, the color filter having a thickness of 1.5 μm can be applied, and in the fourth experimental example Ex4, the color filter having a thickness of 3.3 μm can be applied.

Figure 7A:
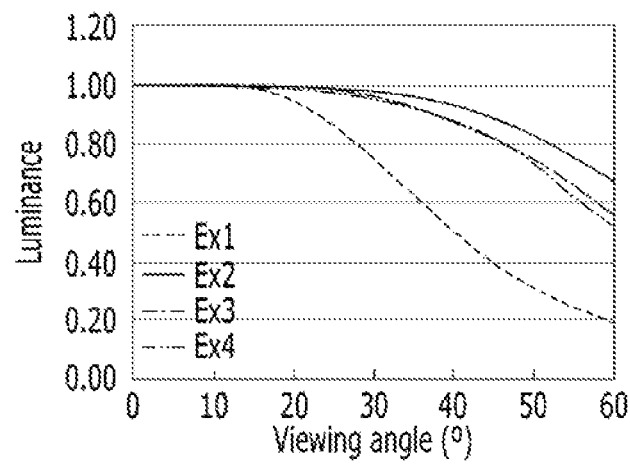
FIGS. 7A to 7C are graphs showing luminance characteristics for each viewing angle with respect to red, green, and blue in the first to fourth experimental examples.
Figure 7B:
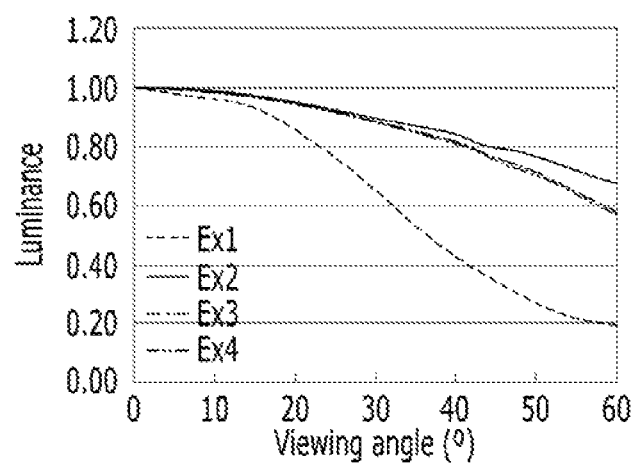
Figure 7C:
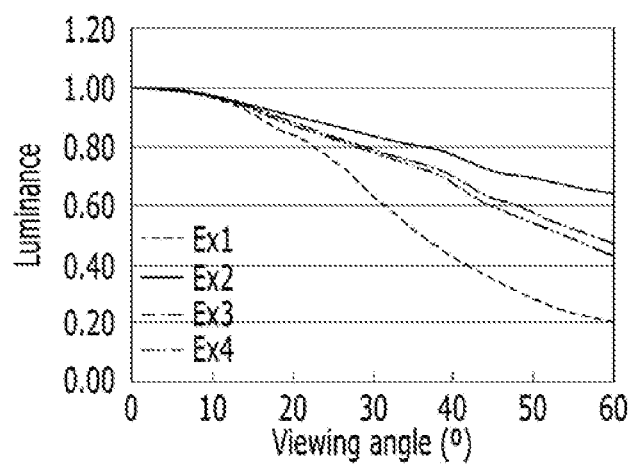

FIGS. 7A to 7C are graphs showing luminance characteristics for each viewing angle with respect to red, green, and blue in the first to fourth experimental examples Ex1 to Ex4.

As shown in FIGS. 7A to 7C, in the first experimental example Ex1, as the viewing angle changes, the tendency to decrease luminance is noticeable in red, green, and blue. In contrast, in the second to fourth experimental examples Ex2 to Ex4, even if the viewing angle changes, luminance need not be greatly diminished.

Figure 8A:
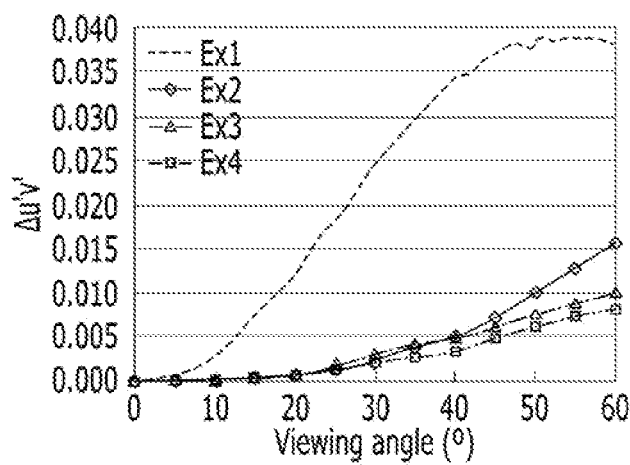
FIGS. 8A to 8C are graphs showing a color luminance deviation for each viewing angle with respect to red, green, and blue according to the first to fourth experimental examples.
Figure 8B:
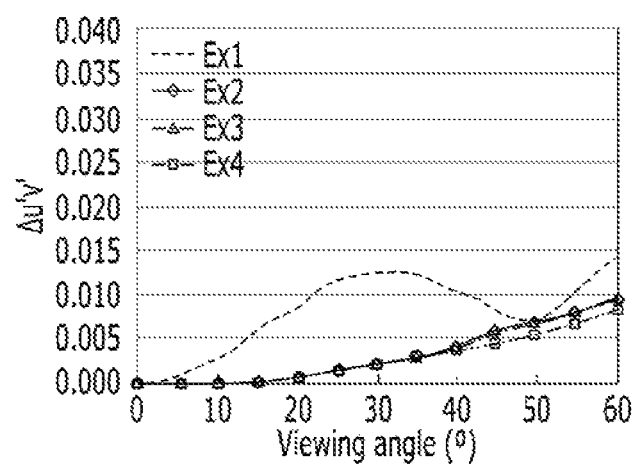
Figure 8C:
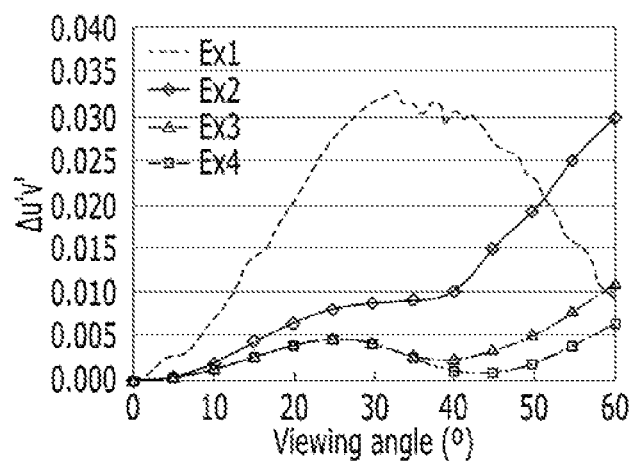

FIGS. 8A to 8C are graphs showing a color luminance deviation Δu'v' for each viewing angle with respect to red, green, and blue according to the first to fourth experimental examples.

As shown in FIGS. 8A to 8C, in the first experimental example Ex1, as the viewing angle changes, a color luminance deviation can be noticeable in red, green, and blue. In contrast, in the third and fourth experimental examples Ex3 to Ex4, even if the viewing angle changes, luminance need not be greatly diminished.

Here, referring to the drawings in addition to FIGS. 7A to 7C, in the second experimental example Ex2, a filter is not applied, and thus the tendency to decrease luminance of a panel need not be greatly diminished, but a color luminance deviation can occur, and in particular, it can be seen that the tendency is serious in blue of FIG. 8C. For example, it can be seen that a color luminance deviation is larger due to reflection of external light in the second experimental example Ex2.

Figure 9A:
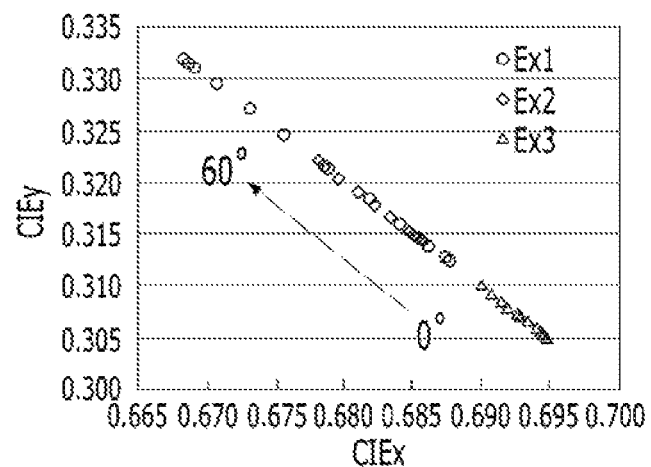
FIGS. 9A to 9C are graphs showing color coordinate fluctuation as viewing angle with respect to red, green, and blue changes according to the first to third experimental examples.
Figure 9B:
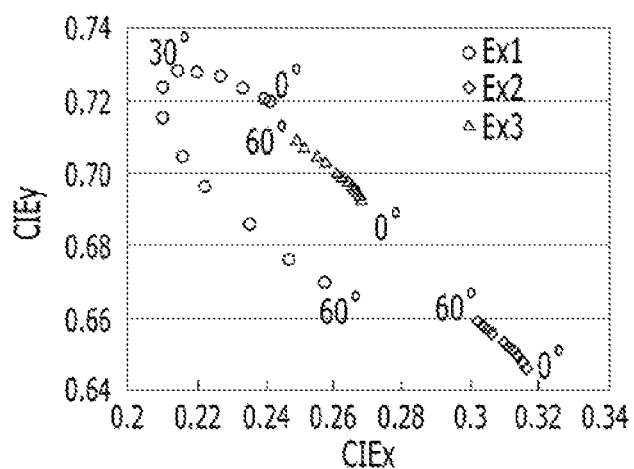
Figure 9C:
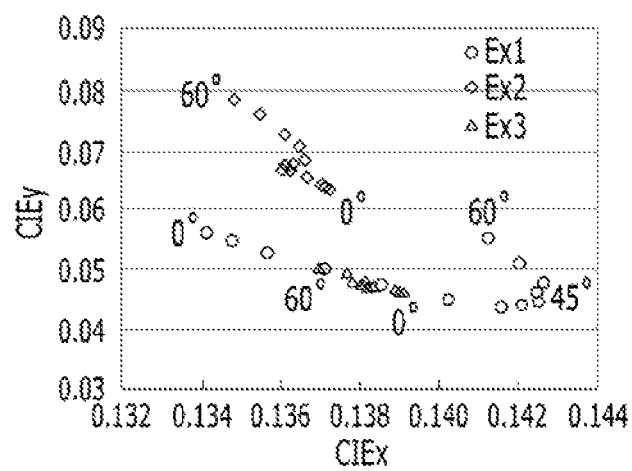

FIGS. 9A to 9C are graphs showing color coordinate fluctuation as viewing angle with respect to red, green, and blue changes according to the first to third experimental examples.

As seen from FIGS. 9A to 9C, in the first experimental example Ex1, as the viewing angle changes, in particular to 60 degrees from 0 degrees, distribution of color coordinate changes is wide.

In the second experimental example Ex2 and the third experimental example Ex3, color coordinate fluctuation can be small in the instance of change in viewing angle to 65 degrees from 0 degrees compared with the first experimental example Ex1. However, the second and third experimental examples Ex2 and Ex3 to which a color filter is not applied can have the tendency of different color purity. In particular, with regard to color coordinate fluctuation of blue in FIG. 9C, in the second experimental example Ex2, a value of CIEy can be relatively changed to 0.08 from 0.06, but in the third experimental example Ex3, fluctuation can be very small to a level of 0.051 from 0.046, and thus, it can be seen that high luminance characteristics are achieved despite change in viewing angle.

Figure 10:
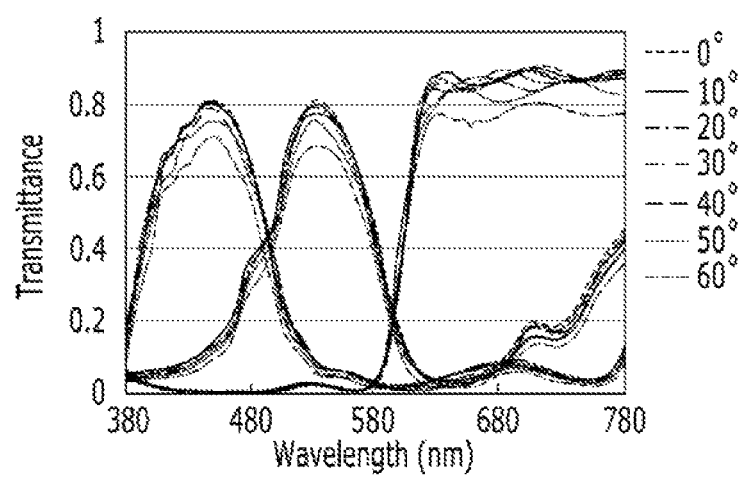
FIG. 10 is a graph showing change in transmittance for each wavelength of a structure to which a color filter is applied according to the third experimental example.
Figure 11A:
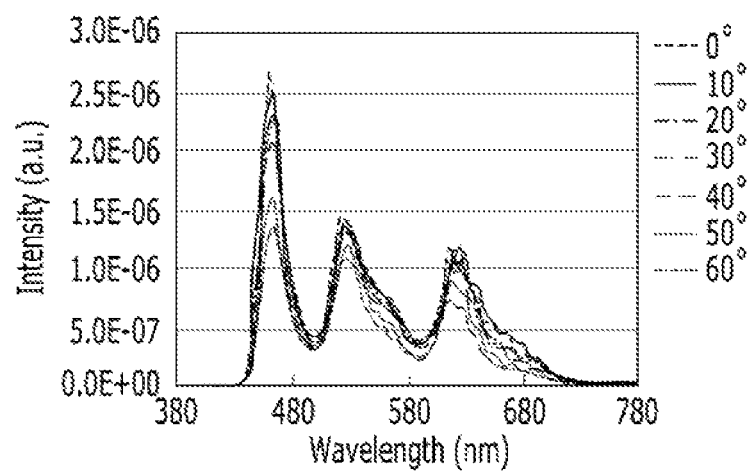
FIGS. 11A and 11B are graphs showing EL spectrums according to second and third experimental examples.
Figure 11B:
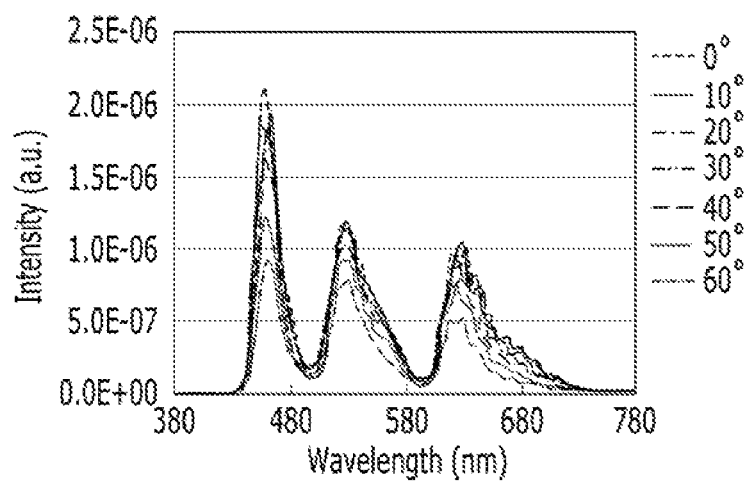

FIG. 10 is a graph showing change in transmittance for each wavelength of a structure to which a color filter can be applied according to the third experimental example. FIGS. 11A and 11B are graphs showing EL spectrums according to second and third experimental examples.

As seen from FIG. 10, in the third experimental example Ex3, transmittance is high even if the viewing angle changes with respect to red, green, and blue.

FIG. 11A shows luminous intensity depending on viewing angle when a color filter is not applied like in the second experimental example Ex2. FIG. 11B shows luminous intensity depending on viewing angle when a color filter can be applied like in the third experimental example Ex3. In the second and third experimental examples, there can be peak characteristics in the same wavelength despite change in viewing angle with respect to blue, green, and red, and thus this means that constant luminance in the second and third experimental examples Ex2 and Ex3 is maintained despite change in viewing angle.

Like in the third and fourth experimental examples Ex3 and Ex4, a color filter instead of a polarizer can be applied to the light-emitting display device according to the embodiments of the present disclosure in order to prevent external light from being reflected, and accordingly, the light-emitting display device according to the embodiments of the present disclosure can have excellent efficiency characteristics, can prevent decrease in luminance, can restrict color coordinate fluctuation, and can have high transmittance as described in the third and fourth experimental examples.

The following description will be given with reference to a fifth experimental example Ex5 in which the optical compensation structure according to the embodiments of the present disclosure is not applied, a high refractive index capping layer can be applied, and a polarizer can be applied thereon, and a sixth experimental example Ex6 in which the optical compensation structure can be applied and a color filter can be applied thereon like in FIG. 1.

TABLE 1

| | Sub-pixel | CIEx | CIEy | DIC overlap ratio (%) | White lifespan (T80) (%) | White effective efficiency (Cd/A) |
|---|---|---|---|---|---|---|
| Ex5 | B | 0.136 | 0.053 | 100 | 100 | 35.1(100) (POL) |
| | G | 0.246 | 0.715 | | | |
| | R | 0.686 | 0.313 | | | |
| Ex6 | B | 0.138 | 0.049 | 100 | 160 | high reflectivity: 51.3(146%) |
| | G | 0.258 | 0.700 | | | low reflectivity: 35.9(102%) |
| | R | 0.258 | 0.307 | | | |

In detail, in the fifth experimental example Ex5, an electrode having high reflectivity (99%) can be used as a first electrode of a light-emitting device, a thickness ratio of a high refractive index capping layer and a low refractive index capping layer above the light-emitting device is 2:1, and an encapsulation layer and a polarizer are sequentially applied thereon. In the sixth experimental example Ex6, the instances in which an electrode having low reflectivity (70%) and an electrode having high reflectivity (99%) are used as the first electrode of the light-emitting device are evaluated, and the instance in which a first layer having a high refractive index and a second layer having a low refractive index are disposed as an optical compensation structure above the light-emitting device and the thickness of the second layer having the low refractive index can be approximately 1.8 times greater than the first layer is evaluated. In the sixth experimental example Ex6, an encapsulation layer and a color filter can be applied above the optical compensation structure. In the sixth experimental example Ex6, the structure according to the first embodiment of the present disclosure can be applied, and accordingly, as described above, it can be seen that excellent color purity, excellent white lifespan, and excellent white effective efficiency are achieved compared with the fifth experimental example Ex6.

As seen from Table 1 above, for example, a value of CIEy of blue in color coordinates in the fifth experimental example Ex5 is 0.053, and a value of CIEy of blue in color coordinates in the sixth experimental example Ex6 is 0.049, and accordingly, blue color purity in the sixth experimental example Ex6 is high.

In the sixth experimental example Ex6, even if a low-reflectivity metal can be applied to a reflective structure used as a first electrode, white effective efficiency can be excellent, and lifespan can also be excellent. In the sixth experimental example Ex6, even if a high-reflectivity metal can be applied to a reflective structure, white efficiency can be 146% based on the fifth experimental example Ex5, and accordingly, when the same electrode structure as the light-emitting device of the fifth experimental example Ex5 is used, it can be seen that all of color purity, lifespan, and effective efficiency are excellent.

The significance of the light-emitting display device through the above experiments will be described below.

In a situation in which product groups are gradually diversified, devices having high luminance characteristics whereby high luminance is maintained despite change in viewing angle to allow a user to view at different viewing angles are required.

However, when the configuration of a known capping layer is used, luminance tends to severely decrease depending on change in viewing angle.

The light-emitting display device according to the embodiments of the present disclosure can be designed to achieve destructive interference in such a way that an optical compensation structure has reverse cavity characteristics, and it can be seen that the light-emitting display device has excellent luminance characteristics despite change in viewing angle, a high lifespan, and high efficiency.

As such, even if a metal having low reflectivity is used to form an electrode used as a reflective electrode, predetermined efficiency or more can be achieved, and thus the use of the reflective electrode need not be restricted. For example, a degree of design freedom can be high.

The light-emitting display device according to the embodiments of the present disclosure can apply a viewing angle structure for the maximum luminance by maintaining an internal cavity in a top emission type light-emitting device and applying a structure in which destructive interference occurs in all of red, green, and blue through an upper optical compensation structure.

In addition, the color filter instead of a polarizer can be applied above the optical compensation structure, and accordingly, color purity can be ensured, reflection of external light can be reduced to a level equal to or greater than 50%, and a level of 50% effective efficiency can be increased even in a destructive interference structure due to a structure without the polarizer.

According to the increase in effective efficiency, it is possible to design up to 70% of the lower low-reflective electrode, thereby increasing a contrast ratio.

When the viewing angle structure for high luminance according to the embodiments of the present disclosure is used together with a color filter, effective efficiency can correspond to high luminance efficiency of 146% compared to a structure without the optical compensation structure according to the embodiments of the present disclosure.

Hereinafter, the light-emitting display device according to the embodiments of the present disclosure will be described with regard to the configuration of a thin film transistor (TFT) on the substrate 100.

Figure 12:
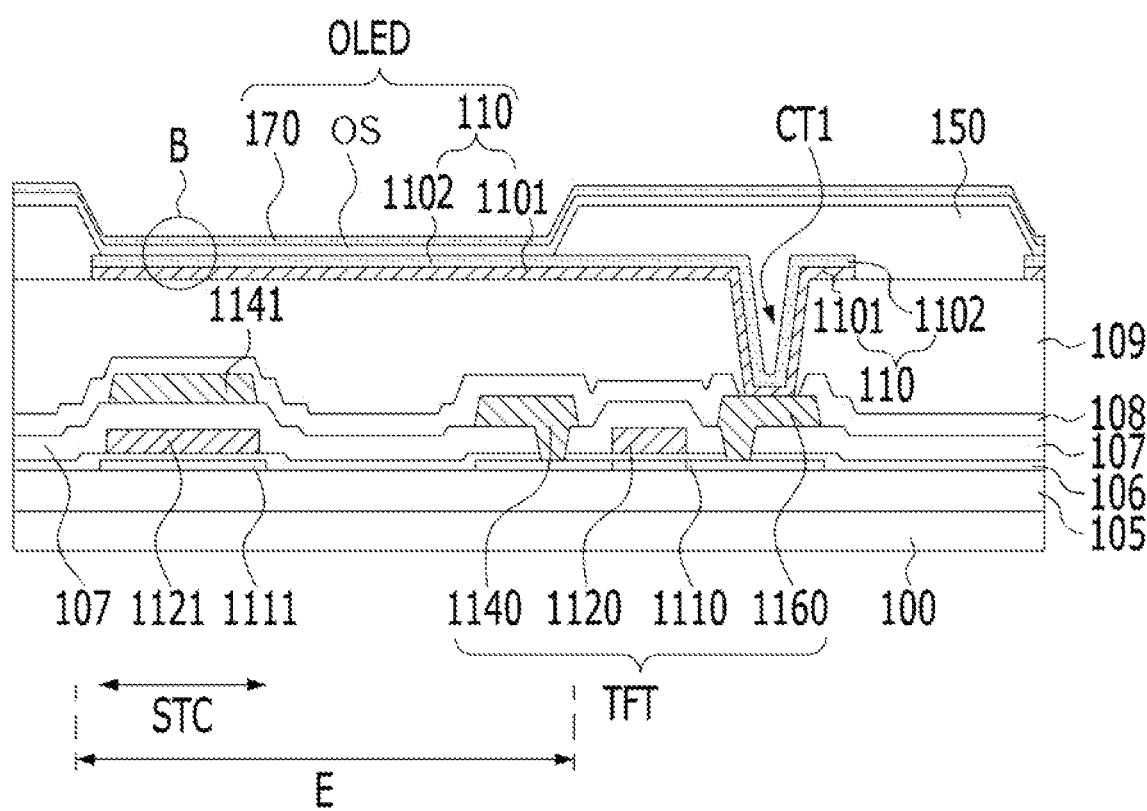
FIG. 12 is a diagram showing a light-emitting display device according to an embodiment of the present disclosure.

FIG. 12 is a diagram showing a light-emitting display device according to an embodiment of the present disclosure.

With reference to FIG. 12, the configuration of a thin film transistor (TFT) connected to a first electrode 110 of sub-pixels will be described.

A buffer layer 105 can be disposed on the substrate 100, and first and second semiconductor layers 1110 and 1111 can be disposed on the buffer layer 105. The buffer layer 105 can prevent impurities remaining on the substrate 100 from being introduced into the first and second semiconductor layers 1110 and 1111. The first and second semiconductor layers 1110 and 1111 can be amorphous or crystalline silicon semiconductor layer or a transparent oxide semiconductor layer. Other types of semiconductors can be used. Opposite sides of a first semiconductor layer 1110, which are connected to a source electrode 1140 and a drain electrode 1160, respectively, can be regions to which impurities are injected, and an intrinsic region between the regions of the first semiconductor layer 1110, to which impurities are injected, can function as a channel region.

The first and second semiconductor layers 1110 and 1111 can include at least one of an oxide semiconductor layer, a poly silicon layer, or an amorphous silicon layer, for example.

The second semiconductor layer 1111 can be positioned to overlap the first and second storage electrodes 1121 and 1141 to be formed thereabove and can be used as an auxiliary storage electrode for increasing capacitance of a storage capacitor when impurities are injected thereinto. Alternatively, as necessary or desired, the second semiconductor layer 1111 can be omitted.

A gate insulating layer 106 can be disposed to cover the first and second semiconductor layers 1110 and 1111, and a gate electrode 1120 and the first storage electrode 1121 can be formed to overlap the intrinsic region of the first semiconductor layer 1110 and the second semiconductor layer 1111.

A first interlayer insulating layer 107 can be disposed to cover the first and second semiconductor layers 1110 and 1111, the gate electrode 1120, and the first storage electrode 1121.

Contact holes can be formed at opposite sides of the first semiconductor layer 1110 by selectively removing the first interlayer insulating layer 107 and the gate insulating layer 106, and the source electrode 1140 and the drain electrode 1160 can be connected to the first semiconductor layer 1110 through the contact holes, respectively. In the same process, the second storage electrode 1141 can be formed on the first interlayer insulating layer 107 to overlap the first storage electrode 1121.

Here, a first thin film transistor TFT for driving a light-emitting device OLED included in a light-emitting unit E can include the first semiconductor layer 1110, the gate electrode 1120 having a channel region that overlaps that of the first semiconductor layer 1110, and the source electrode 1140 and the drain electrode 1160 that are respectively, connected to opposite sides of the first semiconductor layer 1110, which are disposed from bottom to top.

A storage capacitor STC can include the first and second storage electrodes 1121 and 1141 that overlap each other across the first interlayer insulating layer 107 therebetween.

A second interlayer insulating layer 108 can be formed to cover the thin film transistor TFT and the storage capacitor STC.

Here, the thin film transistor TFT and the storage capacitor STC can include light-shielding metal layers and can be disposed not to overlap a transmissive unit T, and thus can overlap the light-emitting unit E (such as red light-emitting unit RE and blue light-emitting unit BE) or can overlap a portion for forming a bank 150. Here, the bank 150 can be positioned between the transmissive unit T and the light-emitting unit E or can be positioned between a red light-emitting region RE and a blue light-emitting region BE of the light-emitting unit E, which are spaced apart from each other. In the instance of the light-emitting unit E, the first electrode 110, as a reflective electrode, can prevent metal layers disposed therebelow from being visible, and in a portion at which the bank 150 is positioned, components disposed therebelow can be prevented from being visible due to the arrangement of the bank 150 having a thickness, which can be relatively thick.

A planarization layer 109 can be further formed to planarize a surface to cover the second interlayer insulating layer 108, and a contact portion CT1 can be formed by selectively removing the planarization layer 109 and the second interlayer insulating layer 108, and accordingly, the thin film transistor TFT and the first electrode 110 can be connected to each other through a contact portion CT1. Although FIG. 12 illustrates a two-layer structure of the first reflective electrode 1101 and the first transparent electrode 1102, transparent electrodes can be formed at lower and upper sides across the first reflective electrode. For example, the first reflective electrode of the first electrode 110 can be formed of a reflective metal, for example, aluminum, aluminum alloy, silver, or silver alloy or can also be formed of an alloy of Ag—Pd—Cu (APC) in order to improve reflective efficiency.

The second electrode (cathode) 170 opposite to the first electrode 110 can be formed of a reflective transmissive metal, for example, magnesium alloy, silver alloy, silver, magnesium, or MgAg. Although described as formed of metals or metal alloys, the first electrode 110 can be a non-metallic material having conductivity. As necessary or desired, a transparent metallic oxide such as indium tin oxide (ITO) or indium zinc oxide (IZO) can also be used. Additionally, the first electrode can be formed of a plurality of layers, including a first layer (or a first reflective electrode) 1101 and a second layer (or a first transparent electrode) 1102. The first layer 1101 and the second layer 1102 can be formed of different materials, but such is not required.

The light-emitting display device according to the embodiments of the present disclosure can emit light through the second electrode 170, and the optical compensation structure 180 can be disposed on the second electrode 170 to increase a light output amount.

An organic stack OS between the first electrode 110 and the second electrode 170 can be commonly configured on the light-emitting unit E and the bank 150 of subpixels, but at least the light-emitting layers can be separately patterned in respective light-emitting units with respect to blue, green, and red subpixels, which emit light with different colors.

A structure including the substrate 100 and a thin film transistor array formed thereon will be referred to as a thin film transistor array substrate. The substrate 100 can be formed as a transparent plastic film in numerous instances, but when a glass substrate is applied, it can be possible to apply the glass substrate when the thickness of the glass substrate is small. Other transparent materials can be used for the substrate 100, but the substrate 100 need not be transparent.

Figure 13:
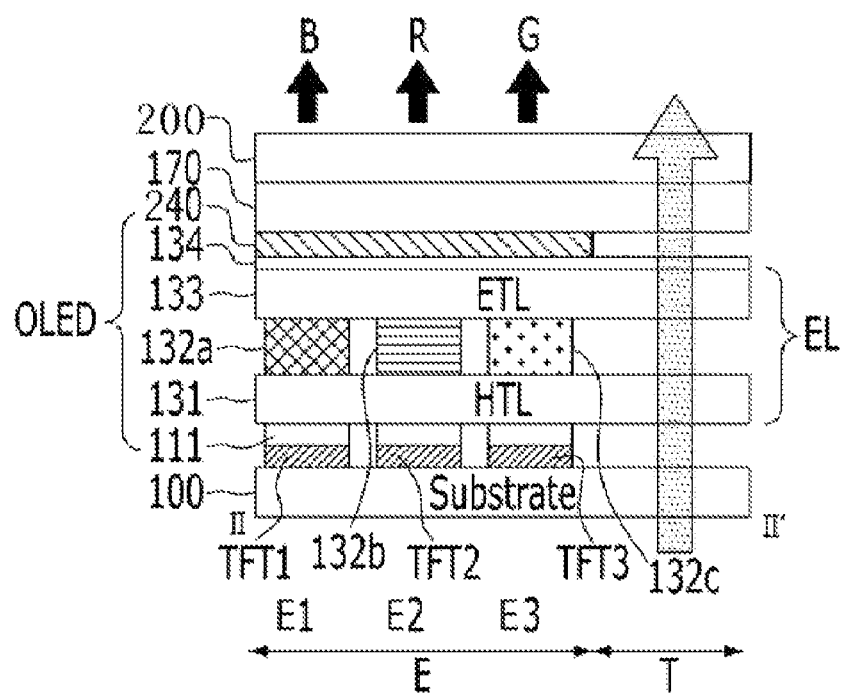
FIG. 13 is a cross-sectional view illustrating a display device according to a fourth embodiment of the present disclosure.
Figure 14:
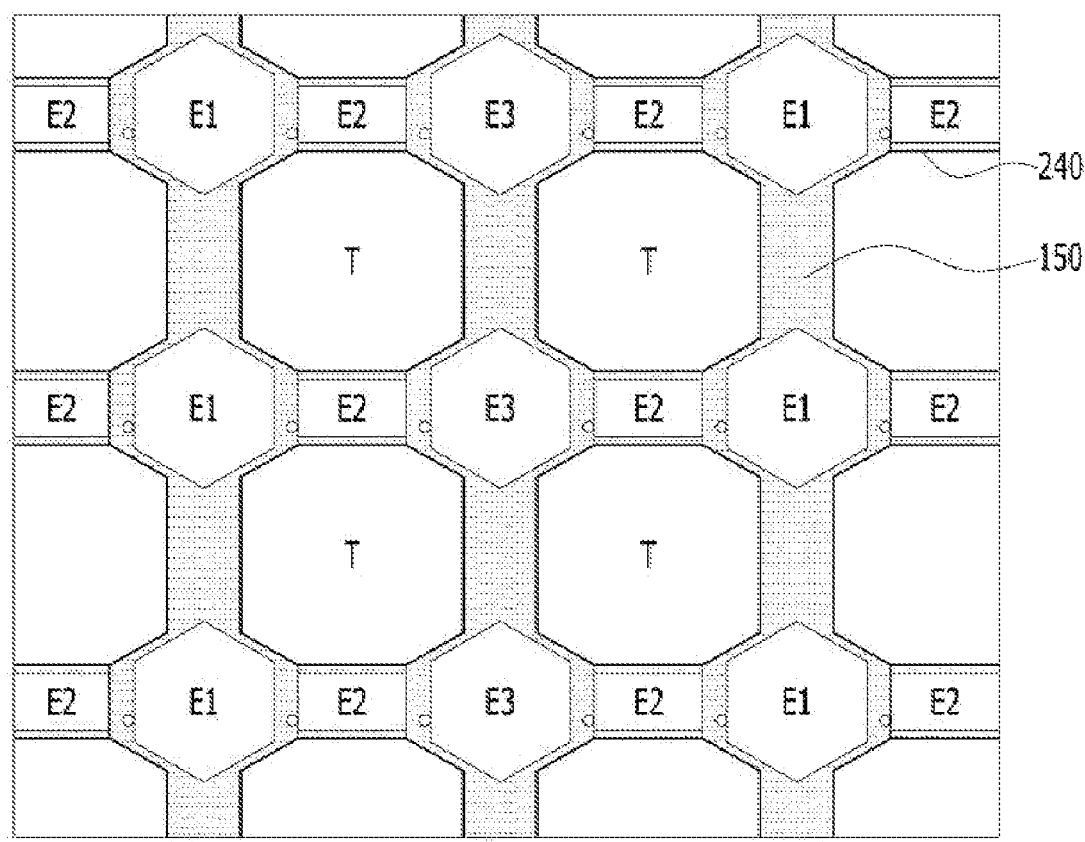
FIG. 14 is a plan view of the display device of FIG. 13.

FIG. 13 is a cross-sectional view illustrating a display device according to a fourth embodiment of the present disclosure. FIG. 14 is a plan view of the display device of FIG. 13.

As shown in FIGS. 13 and 14, the display device according to the embodiments of the present disclosure can further include the transmissive unit T as well as light-emitting units E1, E2, and E3. The display device according FIG. 13 provides a substrate 100, a reflective metal 111, a hole transport layer HTL 131, an emission layer 132a, an electron transport layer ETL 133, an intermediate layer 134, an upper layer 240, a cathode 170, a filter layer 200, among others.

The configuration of the light-emitting units E1, E2, and E3 is the same as that of the aforementioned light-emitting unit E according to the first to third embodiments, and thus a description thereof will be omitted.

The transmissive unit T need not include at least one of the light-emitting layer, the first electrode (e.g., anode), or the second electrode (e.g., cathode).

The embodiments of the present disclosure is regarding a light-emitting display device can comprises a substrate including a plurality of light-emitting units, a light-emitting layer at a light-emitting unit, a reflective structure between the light-emitting layer and the substrate at the light-emitting unit, a transmissive electrode over the light-emitting layer across a plurality of pixels on the substrate, an optical compensation structure in contact with the transmissive electrode and including at least one first layer having a first refractive index and at least one second layer having a second refractive index greater than the first refractive index, the first layer being thicker than the second layer, an encapsulation layer on the optical compensation structure, and a color filter on the encapsulation layer.

The optical compensation structure can have destructive interference characteristics, and a thickness of the first layer can be approximately 1.8 to 2.2 times greater than the second layer.

The optical compensation structure can include a plurality of first layers having the first refractive index and a plurality of second layers having the second refractive index, respectively; and one of the plurality of first layers can be in contact with the transmissive electrode and another of the plurality of first layer can be in contact with the encapsulation layer.

A thickness of each of the first layers can be approximately 1.8 to 2.2 times greater than a thickness of each of the second layers.

The reflective structure can include a reflective metal having a thickness equal to or greater than 100 nm.

The light-emitting display device can further comprise a transparent electrode disposed between the reflective metal and the light-emitting layer and having a smaller thickness than the reflective metal.

The light-emitting display device can further comprises a first command layer and a second common layer disposed below and above the light-emitting layer, respectively, and the reflective metal can be in contact with the first common layer.

The reflective structure can be alternately stacked with a plurality of first refractive index layers and a plurality of second refractive index layers that are different from each other.

The reflective structure can include a metal satisfying a relational expression $$0.3 < 1 - \left[\frac{(n-1)^2 + k^2}{(n+1)^2 + k^2}\right] < 0.03,$$

where n is a refractive index and k being an extinction coefficient of the metal.

The light-emitting layer can include first to third light-emitting layers that emit light with different colors to different regions, the reflective structure includes first to third dielectric Bragg mirrors respectively corresponding to the first to third light-emitting layers and the dielectric Bragg mirror satisfies a relational expression $$\Delta\lambda = \lambda_{peak} * \left|\frac{4}{\pi}\sin^{-1}\left(\frac{n_B - n_A}{n_B + n_A}\right)\right|,$$

wherein $n_A$ is a refractive index of a layer A, and $n_B$ is a refractive index of a layer B.

The light-emitting display device can further comprise a transparent electrode between the reflective structure and the light-emitting layer, and the transparent electrode can have a thickness equal to or greater than 3 nm and the first to third dielectric Bragg mirrors can be positioned between the substrate and the transparent electrode.

Each of the first to third dielectric Bragg mirrors can comprise a plurality of third layers and a plurality of fourth layers alternately disposed, the fourth layer having a different refractive index from a refractive index of the third layer.

The light-emitting display device can further comprise a transmissive unit on the substrate.

According to another embodiment, a light-emitting display device of the embodiments of the present disclosure can comprises a substrate including a light-emitting unit and a transmissive unit, a light-emitting device including a light-emitting layer at the light-emitting unit, an optical compensation structure including a first layer having a first refractive index and a second layer having a second refractive index, on the light-emitting device, the first layer being thicker than the second layer, an encapsulation layer on the optical compensation structure and a color filter on the encapsulation layer.

A thickness of the first layer can be approximately 1.8 to 2.2 times greater than the second layer.

The optical compensation structure can comprise the plurality of layers and the plurality of second layers, respectively and one of the plurality of first layers can be in contact with the light-emitting device and another of the plurality of first layers can be in contact with the encapsulation layer.

The light-emitting device can include a first electrode and a second electrode facing each other, the light-emitting layer between the first and second electrodes, a first common layer between the first electrode and the light-emitting layer and a second common layer between the light-emitting layer and the second electrode. The first electrode includes a reflective layer.

The reflective layer can include a reflective electrode satisfying a relational expression $$0.3 < 1 - \left[ \frac{(n-1)^2 + k^2}{(n+1)^2 + k^2} \right] < 0.03,$$

n being a refractive index and k being an extinction coefficient.

The light-emitting display device can further comprise a transparent electrode between the reflective layer and the first common layer.

The reflective layer has a dielectric Bragg mirror satisfying a relational expression $$\Delta\lambda = \lambda_{peak} * \left| \frac{4}{\pi} \sin^{-1}\left( \frac{n_B - n_A}{n_B + n_A} \right) \right|.$$

The light-emitting display device according to the embodiments of the present disclosure can have the following effects.

First, in the light-emitting display device according to the embodiments of the present disclosure, even if a metal having low reflectivity is used to form an electrode used as a reflective electrode, predetermined efficiency or more can be achieved, and thus the use of the reflective electrode need not be restricted. For example, a degree of design freedom can be high.

Second, the light-emitting display device according to the embodiments of the present disclosure can apply a viewing angle structure for the maximum luminance by maintaining an internal cavity in a top emission type light-emitting device and applying a structure in which destructive interference occurs in all of red, green, and blue through an upper optical compensation structure.

Third, the color filter instead of a polarizer can be applied above the optical compensation structure, and accordingly, color purity can be ensured, reflection of external light can be reduced to a level equal to or greater than 50%, and a level of 50% effective efficiency can be increased even in a destructive interference structure due to a structure without the polarizer.

Fourth, according to the increase in effective efficiency, it is possible to design up to 70% the lower low-reflective electrode, thereby increasing a contrast ratio.

Fifth, when the viewing angle structure for high luminance according to the embodiments of the present disclosure is used together with a color filter, effective efficiency can correspond high luminance efficiency of 146% compared to a structure without the optical compensation structure according to the embodiments of the present disclosure.

It will be apparent to those skilled in the art that various modifications and variations can be made in the embodiments of the present disclosure without departing from the spirit or scope of the disclosures. Thus, it is intended that the embodiments of the present disclosure cover the modifications and variations of this disclosure provided they come within the scope of the appended claims and their equivalents.

What is claimed is:
1. A light-emitting display device comprising:
a substrate including a plurality of light-emitting units;
a light-emitting layer at a light-emitting unit of the plurality of light-emitting units;
a reflective structure between the light-emitting layer and the substrate at the light-emitting unit;
a transmissive electrode over the light-emitting layer;
an optical compensation structure on the transmissive electrode, the optical compensation structure including a plurality of first layers having a first refractive index and a plurality of second layers having a second refractive index, respectively;
an encapsulation layer on the optical compensation structure; and
a color filter on the encapsulation layer,
wherein one of the plurality of first layers is in direct contact with the transmissive electrode,
another of the plurality of first layer is in direct contact with the encapsulation layer,
the second refractive index is greater than the first refractive index, and
a thickness of each of the plurality of first layers is approximately 1.8 to 2.2 times greater than a thickness of one of the plurality of second layers.
2. The light-emitting display device of claim 1, wherein:
the optical compensation structure has destructive interference characteristics to light.
3. The light-emitting display device of claim 1, wherein the reflective structure includes a reflective metal having a thickness equal to or greater than approximately 100 nm.
4. The light-emitting display device of claim 3, further comprising:
a transparent electrode disposed between the reflective metal and the light-emitting layer, the transparent electrode having a smaller thickness than the reflective metal.

5. The light-emitting display device of claim 3, further comprising:
a first common layer and a second common layer disposed below and above the light-emitting layer, respectively, wherein the reflective metal is in contact with the first common layer.

6. The light-emitting display device of claim 1, wherein the reflective structure is alternately stacked with a plurality of first refractive index layers and a plurality of second refractive index layers that are different from each other.

7. The light-emitting display device of claim 1, wherein the reflective structure includes a metal satisfying a relational expression $$0.3 < 1 - \left[\frac{(n-1)^2 + k^2}{(n+1)^2 + k^2}\right] < 0.03,$$

where n is a refractive index and k is an extinction coefficient of the metal.

8. The light-emitting display device of claim 1, wherein:
the light-emitting layer includes first to third light-emitting layers that emit light with different colors to different regions of the light-emitting display device;
the reflective structure includes first to third dielectric Bragg mirrors respectively corresponding to the first to third light-emitting layers; and
the dielectric Bragg mirror satisfies a relational expression $$\Delta\lambda = \lambda_{peak} * \left|\frac{4}{\pi}\sin^{-1}\left(\frac{n_B - n_A}{n_B + n_A}\right)\right|,$$

wherein $n_A$ is a refractive index of a layer A, and $n_B$ is a refractive index of a layer B.

9. The light-emitting display device of claim 8, further comprising:
a transparent electrode between the reflective structure and the light-emitting layer,
wherein the transparent electrode has a thickness equal to or greater than approximately 3 nm; and
the first to third dielectric Bragg mirrors are positioned between the substrate and the transparent electrode.

10. The light-emitting display device of claim 8, wherein each of the first to third dielectric Bragg mirrors comprises a plurality of third layers and a plurality of fourth layers alternately disposed, each fourth layer having a different refractive index from a refractive index of each third layer.

11. The light-emitting display device of claim 1, further comprising:
a transmissive unit on the substrate.

12. A light-emitting display device comprising:
a substrate including a light-emitting unit and a transmissive unit on different parts of the substrate;
a light-emitting device including a light-emitting layer at the light-emitting unit;
an optical compensation structure on the light-emitting device and including a plurality of first layers having a first refractive index and a plurality of second layers having a second refractive index, respectively;
an encapsulation layer on the optical compensation structure; and
a color filter on the encapsulation layer,
wherein one of the plurality of first layers is in direct contact with the transmissive electrode,
another of the plurality of first layer is in direct contact with the encapsulation layer,
the second refractive index is greater than the first refractive index, and
a thickness of each of the plurality of first layers is approximately 1.8 to 2.2 times greater than a thickness of one of the plurality of second layers.

13. The light-emitting display device of claim 12, wherein the light-emitting device includes:
a first electrode and a second electrode facing each other;
the light-emitting layer between the first and second electrodes;
a first common layer between the first electrode and the light-emitting layer; and
a second common layer between the light-emitting layer and the second electrode,
wherein the first electrode includes a reflective layer.

14. The light-emitting display device of claim 13, wherein the reflective layer includes a reflective electrode satisfying a relational expression $$0.3 < 1 - \left[\frac{(n-1)^2 + k^2}{(n+1)^2 + k^2}\right] < 0.03,$$

where n is a refractive index and k being an extinction coefficient of the reflective layer.

15. The light-emitting display device of claim 13, further comprising:
a transparent electrode between the reflective layer and the first common layer.

16. The light-emitting display device of claim 13, wherein the reflective layer has a dielectric Bragg mirror satisfying a relational expression $$\Delta\lambda = \lambda_{peak} * \left|\frac{4}{\pi}\sin^{-1}\left(\frac{n_B - n_A}{n_B + n_A}\right)\right|,$$

wherein $n_A$ is a refractive index of a layer A, and $n_B$ is a refractive index of a layer B.

17. A light-emitting display device comprising:
a substrate including a light-emitting unit and a transmissive unit on different parts of the substrate;
a light-emitting device including a light-emitting layer at the light-emitting unit and not on the transmissive unit;
an optical compensation structure including a plurality of first layers having a first refractive index and a plurality of second layers having a second refractive index, respectively;
an encapsulation layer on the optical compensation structure; and
a color filter on the encapsulation layer at the light-emitting unit and not at the transmissive unit,
wherein one of the plurality of first layers is in direct contact with the transmissive electrode,
another of the plurality of first layer is in direct contact with the encapsulation layer,
the second refractive index of each of the plurality of second layers is greater than the first refractive index of each of the plurality of first layers, and
a thickness of each of the plurality of first layers is approximately 1.8 to 2.2 times greater than a thickness of one of the plurality of second layers.

18. The light-emitting display device of claim 17, wherein the encapsulation layer is disposed commonly on the optical compensation structure over the light-emitting unit and the transmissive unit.

19. The light-emitting display device of claim 17, wherein a thickness of the optical compensation structure over the transmissive unit is greater than a thickness of the optical compensation structure over the light-emitting unit.

* * * * *